(12) United States Patent
Sung et al.

(10) Patent No.: US 12,415,884 B2
(45) Date of Patent: Sep. 16, 2025

(54) EPOXY RESIN COMPOSITION AND HEAT DISSIPATION CIRCUIT BOARD USING SAME

(71) Applicant: MAGNATECH CO., LTD., Jeollanam-do (KR)

(72) Inventors: Soo-hyun Sung, Seoul (KR); Nae-won Lee, Gyeonggi-do (KR); Jin-pyo Lee, Sejong (KR)

(73) Assignee: Magnatech Co., Ltd., Jeollanam-Do (KR)

( * ) Notice: Subject to any disclaimer, the term of this patent is extended or adjusted under 35 U.S.C. 154(b) by 589 days.

(21) Appl. No.: 17/761,111

(22) PCT Filed: Nov. 28, 2019

(86) PCT No.: PCT/KR2019/016557
§ 371 (c)(1),
(2) Date: Mar. 16, 2022

(87) PCT Pub. No.: WO2021/054527
PCT Pub. Date: Mar. 25, 2021

(65) Prior Publication Data
US 2022/0325033 A1   Oct. 13, 2022

(30) Foreign Application Priority Data

Sep. 18, 2019 (KR) .................. 10-2019-0114907

(51) Int. Cl.
*C08G 59/32* (2006.01)
*C08G 59/42* (2006.01)
(Continued)

(52) U.S. Cl.
CPC ............ *C08G 59/32* (2013.01); *C08G 59/42* (2013.01); *C08G 59/621* (2013.01); *C08K 3/22* (2013.01);
(Continued)

(58) Field of Classification Search
CPC ...... C08G 59/32; C08G 59/42; C08G 59/621; C08K 3/22; C08K 3/28; C08K 7/18;
(Continued)

(56) References Cited

U.S. PATENT DOCUMENTS 9,832,870 B2 * 11/2017 Kobayashi ......... C08G 59/4014
11,208,525 B2 * 12/2021 Katagi ................... C08G 59/24
(Continued)

FOREIGN PATENT DOCUMENTS

JP   H04-061193 A   2/1992
JP   2002-076549 A   3/2002
(Continued)

OTHER PUBLICATIONS

Tsuchiya, JP-2011225856-MT (Year: 2011).*
(Continued)

*Primary Examiner* — Peter F Godenschwager
*Assistant Examiner* — Zhen Liu
(74) *Attorney, Agent, or Firm* — Akerman LLP

(57) ABSTRACT

The present disclosure relates to an epoxy resin composition having a thermal conductivity of at least 5 W/m·k, which has a sufficient thermal emission effect when implementing a multilayer circuit and can replace a ceramic substrate used in automobiles, electric vehicles and home appliances, and the like, and to a heat dissipation circuit board using the same. The epoxy resin composition according to one embodiment of the present disclosure, the epoxy resin composition includes an epoxy resin, a curing agent and an inorganic filler. The inorganic filler may include alumina having a maximum particle diameter of less than 32 μm and aluminum nitride having a mean particle diameter of 0.5 to 1.0 μm, in an amount of 85 wt % or more. The epoxy resin composition includes an inorganic filler having a mean particle diameter of 1.0 μm to form an insulating layer
(Continued)

having excellent thermal conductivity and withstand voltage properties, thereby providing a high heat dissipation circuit board that is superior compared to existing single layer circuit boards.

7 Claims, 1 Drawing Sheet

(51) Int. Cl.
*C08G 59/62* (2006.01)
*C08K 3/22* (2006.01)
*C08K 3/28* (2006.01)
*C08K 7/18* (2006.01)
*H05K 1/02* (2006.01)

(52) U.S. Cl.
CPC ............... *C08K 3/28* (2013.01); *C08K 7/18* (2013.01); *H05K 1/0209* (2013.01); *C08K 2003/2227* (2013.01); *C08K 2003/282* (2013.01); *C08K 2201/001* (2013.01); *C08K 2201/003* (2013.01)

(58) Field of Classification Search
CPC ...... C08K 2003/2227; C08K 2003/282; C08K 2201/001; C08K 2201/003; C08K 2201/005; C08K 2201/014; H05K 1/0209; H05K 1/0313; C08L 15/00; C08L 63/00; C08L 83/04
See application file for complete search history.

(56) References Cited

U.S. PATENT DOCUMENTS

| | | | |
|---|---|---|---|
| 2014/0048316 A1* | 2/2014 | Yun | C08G 59/30 523/400 |
| 2015/0021763 A1* | 1/2015 | Na | H01L 24/17 257/737 |
| 2016/0122604 A1* | 5/2016 | Yoshimoto | C08G 59/32 252/74 |
| 2021/0238465 A1* | 8/2021 | Otsuka | C09C 3/10 |

FOREIGN PATENT DOCUMENTS

| | | | |
|---|---|---|---|
| JP | 2007-021763 A | | 2/2007 |
| JP | 2009049062 A | * | 3/2009 |
| JP | 2011225856 A | * | 11/2011 |
| JP | 2014-037536 A | | 2/2014 |
| JP | 2019151839 A | * | 9/2019 |
| KR | 10-2015-0025319 A | | 3/2015 |

OTHER PUBLICATIONS

Kenji, JP-2009049062-MT (Year: 2009).*
Kato, JP-2019151839-MT (Year: 2019).*
International Search Report dated Jun. 16, 2020, issued in connection with PCT/KR2019/016557.

* cited by examiner

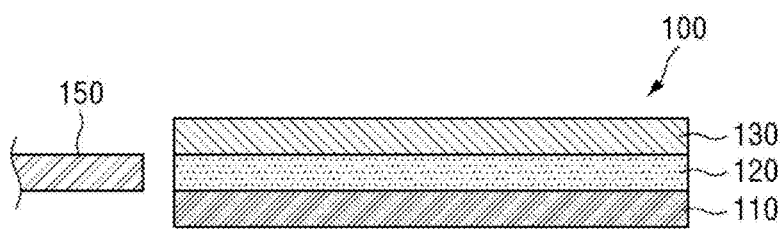

EPOXY RESIN COMPOSITION AND HEAT DISSIPATION CIRCUIT BOARD USING SAME

CROSS-REFERENCE TO RELATED APPLICATIONS

This application is a national phase of PCT/KR2019/016557, filed Nov. 28, 2019, and claims priority to Korean Patent Application No. 10-2019-0114907, filed Sep. 18, 2019, the entire contents of both of which are hereby incorporated by reference.

BACKGROUND

Field

The present disclosure relates to an epoxy resin composition and to a heat dissipation circuit board using the same. More particularly, the present disclosure relates to an epoxy resin composition having a thermal conductivity of at least 5 W/m·k, which has a sufficient thermal emission effect when implementing a multilayer circuit and can replace a ceramic substrate used in automobiles, home appliances, electric vehicles and the like, and to a heat dissipation circuit board using the same.

Description of the Related Art

A circuit board is a substrate for mounting electric parts and the like, which includes a circuit pattern on an electrically insulating substrate.

Among these electric parts, light-emitting diodes for lighting and parts for driving inverters for automobiles/home appliances generate a large amount of heat, causing a problem of reducing the life and efficiency of those parts. In particular, ceramic boards are used as circuit boards for driving inverters for automobiles/home appliances. However, in the light of productivity and high costs, attempts are made to find alternative materials.

Meanwhile, in order to facilitate heat dissipation of the circuit board, the thermal conductivity of an insulating layer formed on the circuit board is the most important technical factor.

In order to increase the thermal conductivity of such an insulating layer, required is high density filling to an extent that an inorganic filler content is 85 to 90 wt %. To this end, when securing a thermal conductivity of 5 W/m·k by pretreating the inorganic filler and applying nanoparticles of less than 1.0 µm, obtained was a result that it was possible to replace a multilayer substrate or a ceramic substrate for improving the level of integration.

Further, a substrate applied to an automobile and the like should have a heat resistant temperature of at least 150° C., meaning that the glass transition temperature should be 150° C. or higher. Epoxy resin applicable hereto should include at least three epoxy reactive groups in the molecular structure, and, for example, YDCN of Kukdo chemical Co., Ltd., EOCN and EPPN of Nippon Kayku Co., Ltd, and the like are available. When applying a phenolic curing agent (various products such as Japan Meiwa HF are available) as a curing agent, obtained was a result that it was possible to increase the glass transition temperature to 190° C.

SUMMARY

The present disclosure aims to provide an epoxy resin composition that has a thermal conductivity of at least 5 W/m·k and has a sufficient thermal emission effect when implementing a multilayer circuit and can replace a ceramic substrate used in automobiles, home appliances, electric vehicles and the like.

Further, the present disclosure aims to provide a heat dissipation circuit board having the thermal efficiency improved by using the epoxy resin composition.

Meanwhile, technical aims to be achieved by the present disclosure are not limited to the aforementioned aims, and other not-mentioned technical aims may be clearly understood by ordinary skilled person in the art to which the present disclosure pertains from the description below.

According to a first aspect of the present disclosure described herein, an epoxy resin composition may include an epoxy resin, a curing agent and an inorganic filler. The inorganic filler may include alumina having a maximum particle diameter of less than 32 µm and aluminum nitride having a mean particle diameter of 0.5 to 1.0 µm, in an amount of 85 wt % or more. The alumina may be applied by mixing at least two types of alumina out of three types having a spherical shape and a mean particle diameter of 8.0, 2.0 and 0.8 µm, respectively.

According to another aspect of the present disclosure described herein, the inorganic filler may be included in an amount of 85 wt % or more with respect to the total weight of the epoxy resin composition.

According to another aspect of the present disclosure described herein, the inorganic filler may include spherical shaped alumina having a mean particle diameter of 0.5 to 1 µm and the aluminum nitride in an amount of 60 wt % or more.

According to another aspect of the present disclosure described herein, the inorganic filler may include the aluminum nitride having a mean particle diameter of 0.5 to 1.0 µm in an amount of 40 wt % or more.

According to another aspect of the present disclosure described herein, the alumina may be pretreated for at least 12 hours using an alumina ball mill and then used in order to secure dispersibility.

According to another aspect of the present disclosure described herein, the alumina may be introduced in the last step of a manufacturing process of the epoxy resin composition and manufactured in a nitrogen atmosphere, in order to prevent properties from deteriorating due to reaction of moisture and air when mixed with aluminum nitride.

According to another aspect of the present disclosure described herein, the epoxy resin composition may include 2 to 5 wt % of rubber oil resulting from reacting epoxy-modified butadiene rubber at a side chain and amine-modified silicon oil at both ends at 120° C. for 1 hour, in order to prevent defects in a processing process of a heat dissipation circuit board, which is caused by poor adhesion and vulnerability to internal impact due to a content of the inorganic filler of 85 wt % or more.

According to another aspect of the present disclosure described herein, the epoxy resin may satisfy a thermal conductivity of at least 5 W/m·k when including the inorganic filler in an amount of 85 to 90 wt % or more, in which the alumina and the aluminum nitride are mixed.

According to a second aspect of the present disclosure described herein, a heat dissipation circuit board may include: a metal plate 110; an insulating layer 120 formed on an upper part of the metal plate 110; and a circuit pattern 130 formed on an upper part of the insulating layer 120, wherein the insulating layer 120 may be formed by curing an epoxy resin composition including an epoxy resin, a curing agent and an inorganic filler.

Advantageous Effect

According to one embodiment of the present disclosure, it is capable of provide an epoxy resin composition having improved dispersibility by pretreating alumina having a maximum particle diameter of less than 32 μm, followed by applying the pretreated alumina, and mixing with aluminum nitride of less than 1.0 μm, thereby increasing thermal conductivity of a heat dissipation circuit board.

Further, according to one embodiment of the present disclosure, it is capable of manufacturing a heat dissipation circuit board having a high heat dissipation property, that is, a thermal conductivity of at least 5 W/m·k allowing replacing a multilayer substrate or a ceramic substrate, by using an epoxy resin composition as an insulating material.

Yet further, according to one embodiment of the present disclosure, it is capable of manufacturing a heat dissipation circuit board by using an epoxy resin composition having a glass transition temperature of 150° C. or higher by using an epoxy resin and a curing agent, and of using this as a circuit board for electronic devices requiring high heat resistance to allow cost reduction and productivity improvement.

Meanwhile, advantageous effects to be obtained by the present disclosure are not limited to the aforementioned effects, and other not-mentioned advantageous effects may be clearly understood by ordinary skilled person in the art to which the present disclosure pertains from the description below.

BRIEF DESCRIPTION OF THE DRAWINGS

FIG. 1 is a side cross sectional view of a heat dissipation circuit board according to one embodiment of the present disclosure.

DETAILED DESCRIPTION OF THE PREFERRED EMBODIMENT

Hereinafter, preferred embodiments of the present disclosure will be described in detail with reference to the accompanying drawings. The detailed description to be described hereinafter together with the accompanying drawings is intended to describe exemplary embodiments of the present disclosure, and is not limited to represent the only embodiments in which the present disclosure may be practiced. The following detailed description includes specific details to provide a thorough understanding of the present disclosure. However, those of ordinary skill in the art to which the present disclosure pertains know that the present disclosure may be practiced without these specific details.

In some cases, in order to avoid obscuring the concept of the present disclosure, well-known structures and devices may be omitted, or may be illustrated in a block diagram mainly with core functions of each structure and device.

Throughout the specification, when a part is said to "comprising or including" a certain element, it means that other elements can be further included rather than excluding other elements unless specifically stated to the contrary. In addition, the term " . . . part" described in the specification means a unit that processes at least one function or operation.

In addition, "a or an", "one", "the" and similar related words may be used as the meaning of including both the singular and the plural in in the context of describing the present disclosure (especially in the context of the following claims), unless otherwise indicated differently from the present specification or contradicted clearly by the context.

In describing the embodiments of the present disclosure, if it is determined that a detailed description of a known function or configuration may unnecessarily obscure the subject matter of the present disclosure, the detailed description thereof will be omitted. In addition, terms to be described hereinafter are terms defined in the light of functions in the embodiments of the present disclosure, which may vary according to the intention or custom of users or operators. Therefore, the definition should be made based on the contents throughout the present specification.

Example 1: Epoxy Resin Composition

An epoxy resin composition of the present disclosure has a thermal conductivity of at least 5 W/m·k and a sufficient thermal emission effect when implementing a multilayer circuit layer, and is composed of an epoxy resin, a curing agent and an inorganic filler to form a heat dissipation circuit board that can replace a ceramic substrate used in automobiles, home appliances, electric vehicles and the like.

As for the epoxy resin, a multifunctional epoxy including at least three reactive groups is applied. The epoxy resin is not mixed with other epoxy resins having different structures. YDCN of Kukdo chemical Co., Ltd., EOCN and EPPN of Nippon Kayku Co., Ltd, and the like may be available as one example of the epoxy resin having a multifunctional group.

As for the curing agent, it is preferable to apply a phenolic curing agent. An acid anhydride curing agent having a superior withstand voltage property may also be applied as the curing agent. However, the acid anhydride curing agent is hardly used because raw materials thereof are vulnerable to moisture. The curing agent is applied to those having at least three reactive groups in one molecule. Japan Meiwa HF, MEH-7800, MEH-7500 and the like are available as an example of the curing agent. Further, the curding agent is not mixed with other curing agents having different structures.

The inorganic filler is included in the epoxy resin composition in an amount of 85 to 90 wt % with respect to the entire epoxy resin composition, and mixed with alumina (aluminum oxide) alone or alumina and aluminum nitride.

Herein, limiting the weight of the inorganic filler to 85 to 90 wt % with respect to the entire epoxy resin composition as described above is to accomplish a thermal conductivity of 3 W/m·k when the amount of the inorganic filler added is that of the alumina applied alone, and also to satisfy a thermal conductivity of at least 5 w/m·k when a content of the inorganic filler is 90 wt %(40 wt % of aluminum nitride+50 wt % of alumina).

On the other hand, when a content of the inorganic filler is less than 85 wt %, the above-described effects such as high conductivity, thermal expansion and the like are not sufficiently exhibited. When a content of the inorganic filler exceeds 90 wt %, adhesion is remarkably lowered, causing difficulties in securing stable physical properties.

The alumina has a spherical shape in which those having a mean particle diameter of 8.0, 2.0 and 0.7 μm are mixed. In particular, at least two types of alumina out of three types of 8.0, 2.0 and 0.7 μm respectively are mixed. However, the alumina of 0.7 μm should be applied to the inorganic filler in a ratio not exceeding 20 wt %.

The alumina is pretreated with a ball mill and then used, wherein a pretreatment time of the alumina may be set to 12 hour or more. Herein, using the pretreated alumina is to sufficiently secure dispersibility of the alumina that has a high hardness and cannot secures withstand voltage and thermal conductivity properties by a general dispersion method due to hydrogen bonding.

Further, when mixing with aluminum nitride, the alumina should be dispersed in a nitrogen atmosphere. Herein, dispersing the alumina in the nitrogen atmosphere is to prevent properties of the alumina from deteriorating due to reaction of moisture and air when mixed with aluminum nitride.

Furthermore, the alumina may be manufactured by mixing those having a maximum particle diameter of less than 32 μm and a mean particle diameter of 2 to 10 μm in an appropriate mixing ratio.

The aluminum nitride may be manufactured with those having a maximum particle diameter of less than 32 μm and a mean particle diameter of 0.5 to 1.0 μm in the same manner as the alumina. The aluminum nitride maybe included in the inorganic filler in an amount of 40 to 60 wt % or more when mixed with the alumina.

The epoxy resin composition of the present disclosure including the epoxy resin, the curing agent and the inorganic filler may further include 2 to 5 wt % of rubber oil resulting from reacting epoxy-modified butadiene rubber at a side chain and amine-modified silicon oil at both ends at 120° C. for 1 hour, in order to prevent defects in a processing process of a heat dissipation circuit board, which are caused by poor adhesion and vulnerability to internal impact due to a content of the inorganic filler of 85 wt % or more.

Accordingly, when the epoxy resin composition includes those epoxy resin, curing agent and inorganic filler as main components, each of those epoxy resin, inorganic filler, curing agent and impact modifier satisfy 7 to 10 wt. %, 85 to 90 wt %, 3 to 5 wt % and 2 to 5 wt % of the total weight respectively.

On the other hand, other components of the epoxy resin composition besides the epoxy resin, the curing agent, the inorganic filler and the impact modifier are dissolved in a solvent (for example, MEK, MIBK), followed by applying heat and stirring. Then, the pretreated inorganic filler, alumina is introduced thereinto, followed by uniformly mixing with a mixer and the like. However, the aluminum nitride in inorganic fillers is added later on in a nitrogen atmosphere, followed by mixing. Further, the solvent satisfies 10 to 15 wt % with respect to the total weight of the epoxy resin composition.

The epoxy resin composition of the present disclosure as the above may be applied to a heat dissipation circuit board 100 shown in FIG. 1.

Example 2: Heat Dissipation Circuit Board

A heat dissipation circuit board 100 of the present disclosure is composed of a metal plate 110, an insulating layer 120 and a circuit pattern 130, as shown in FIG. 1.

The metal plate 110, for example, may be processed with at least one of copper, aluminum and iron alloy that have good thermal conductivity.

The insulating layer 120 is formed by using an epoxy resin composition of the present disclosure, which includes an epoxy resin, a curing agent and an inorganic filler as main components, so that thermal conductivity is improved and heat of an exothermic element 150 is easily transferred to the metal plate 110.

Example 3: Measurement of Thermal Conductivity, Withstand Voltage and Adhesion of Heat Dissipation Circuit Board

TABLE 1

|  | Product name/ Partile diameter | Example 1 | Example 2 | Example 3 | Example 4 | Example 5 | Comparative example 1 | Comparative example 2 | Comparative example 3 | Comparative example 4 |
|---|---|---|---|---|---|---|---|---|---|---|
| Epoxy | YDCN500 | 8.7 | 6.9 |  | 4.6 |  | 8.7 |  | 4.6 | 8.7 |
|  | EPPN501HY |  |  | 5.7 |  | 8.7 |  |  |  |  |
|  | YD128 |  |  |  |  |  |  | 8.7 |  |  |
| Curing agent | HF1 | 4.3 |  |  |  |  | 4.3 | 4.3 |  | 4.3 |
|  | MEH7500 |  |  | 2.9 |  | 4.3 |  |  |  |  |
|  | MEH7800 |  | 6.1 |  | 4.0 |  |  |  | 4.0 |  |
| Impact modifier | Modified silicone rubber | 2.0 | 2.0 | 1.4 | 1.4 | 2.0 | 2.0 | 2.0 | 1.4 | 2.0 |
| Curing catalyst | 2MI | 0.1 | 0.1 | 0.1 | 0.1 | 0.1 | 0.1 | 0.1 | 0.1 | 0.1 |
| Mean particle diameter of alumina (μm) | | 8.0 2.0 0.7 | 51 17 17 | 51 17 17 | 30 20 | 30 20 | 17 17 | 51 17 17 | 51 17 | 21 18 | 51 17 17 |
| Mean particle diameter of aluminum nitride (μm) | | 0.9 |  |  | 40 | 40 | 51 |  | 17 |  | 51 |

Alumina and aluminum nitride applied to comparative example 1 had a maximum particle diameter of 72 μm and were not pretreated with a ball mill.
Alumina and aluminum nitride applied to comparative example 4 had a maximum particle diameter of 32 μm and were not pretreated with a ball mill.
Except example 1, alumina and aluminum nitride having a maximum particle diameter of less than 32 μm were applied.

In product name/particle diameter of the above [Table 1], in, 'YDCN' and 'YD128' are epoxy of Kukdo chemical Co., Ltd., and 'HF1', 'MEH7500', 'MEH7800' are phenols of Japan Meiwa. Measured was thermal conductivity of a heat dissipation circuit board 100 of examples 1 to 5 and comparative examples 1 to 3 described in the above [Table 1] by transient hot-wire method using a LFA447 type thermal conductivity meter of NETZSCH as shown in [Table 2] below.

Further, analyzed was the heat dissipation circuit board 100 of examples 1 to 5 and comparative examples 1 to 3 described in the above [Table 1] at a heating rate of 10° C./min by using a thermomechanical analyzer, TA instrument DSC Q100.

TABLE 2

| Experiment number | Thermal conductivity (w/m · k) | Withstand voltage (kv/mil) | Glass transition temperaturetg (° C.) | Adhesion (kgf/cm) |
|---|---|---|---|---|
| Example 1 | 3.2 | 1.45 | 150 | 1.4 |
| Example 2 | 3.1 | 1.43 | 130 | 1.5 |
| Example 3 | 5.3 | 1.5 | 175 | 1.2 |
| Example 4 | 5.3 | 1.4 | 130 | 1.25 |
| Example 5 | 6.8 | 1.5 | 175 | 1.4 |
| Comparative Example 1 | 2.3 | 0.8 | 150 | 1.4 |
| Comparative Example 2 | 3.1 | 1.4 | 100 | 1.2 |
| Comparative Example 3 | 6.4 | 0.6 | 178 | 0.8 |
| Comparative Example 4 | 2.2 | 1.1 | 150 | 1.3 |

As comparing properties of example 1 and comparative examples 1 and 4, which include the same amount of an inorganic filler, as shown in [Table 2] above, the thermal conductivity of comparative examples 1 and 4 was measured 30% lower than that of example 1. The withstand voltage thereof was also measured significantly lower than example 1. Hereby, it was found that the dispersibility was improved due to the pretreatment of alumina and the withstand voltage property was also remarkably increased by the dielectric breakdown path extended when measuring the withstand voltage with setting a maximum particle diameter to less than 32 μm. As comparing examples 1 and 2 with examples 3 and 4, it was found that the content of the inorganic filler was 90 wt % of an epoxy resin composition and that when mixing with 40 wt % of aluminum nitride, the thermal conductivity thereof was at least 5 w/m·k allowing replacing a ceramic substrate.

Further, as for examples Sand 5, it was found that the glass transition temperature was 175° C., thereby allowing applying the heat dissipation circuit board to a high heat resistant circuit board for electronic devices.

Particularly, as for example 5, the content of the inorganic filler was 85 wt %. However, it was capable of securing the maximum value of the thermal conductivity in the subjected heat dissipation circuit board 100 by mixing with the aluminum nitride in an amount of 50 wt % or more. Hereby, it was found that the same level of heat transfer capability as in example 3 was secured notwithstanding increasing the thickness of the insulating layer 120. Further, no decrease in adhesion occurred.

In contrast, as for comparative example 3, the content of the inorganic filler and aluminum nitride were 90 wt % and 50 wt %, respectively. However, the thermal conductivity was not improved while the withstand voltage property and adhesion were decreased. Hereby, it was experimentally shown that the aluminum nitride had an angular phase and thus had a limitation in filling thereof.

The above description of the present disclosure is for illustrative purposes only, and those of ordinary skill in the art to which the present invention pertains will be able to understand that it is possible to modify the present disclosure to other specific forms easily without changing the technical spirit or essential features thereof. Therefore, it should be understood that the embodiments described above are illustrative and non-limiting in all respects. For example, each component described as a single type may be implemented in a distributed manner, and similarly, components described as being distributed may also be implemented into a combined form.

The scope of the present disclosure is indicated by the following claims to be described hereinafter rather than the detailed description. All changes or modified forms derived from the meaning and scope of the claims and their equivalent concepts should be construed as being included in the scope of the present disclosure.

What is claimed is:

1. An epoxy resin composition comprising an epoxy resin, a curing agent and an inorganic filler, wherein
    the inorganic filler includes alumina having a maximum particle diameter of less than 32 μm and aluminum nitride having a mean particle diameter of 0.5 to 1.0 μm,
    the inorganic filler is included in an amount of 85 wt % or more with respect to the total weight of the epoxy resin composition,
    the alumina is applied by mixing at least two types of alumina out of three types having a spherical shape and a mean particle diameter of 8.0, 2.0 and 0.8 μm, respectively, the epoxy resin composition includes 2 to 5 wt % of rubber oil resulting from reacting epoxy-modified butadiene rubber at a side chain and amine-modified silicon oil at both ends at 120° C. for 1 hour, in order to prevent defects in a processing process of a heat dissipation circuit board, which is caused by poor adhesion and vulnerability to internal impact due to a content of the inorganic filler of 85 wt % or more with respect to the total weight of the epoxy resin composition.

2. The epoxy resin composition of claim 1, wherein
    the inorganic filler includes spherical shaped alumina having a mean particle diameter of 0.5 to 1 μm and the aluminum nitride in an amount of 60 wt % or more.

3. The epoxy resin composition of claim 1, wherein
    the inorganic filler includes the aluminum nitride having a mean particle diameter of 0.5 to 1.0 μm in an amount of 40 wt % or more.

4. The epoxy resin composition of claim 1, wherein
    the alumina is pretreated for at least 12 hours using an alumina ball mill and then used in order to secure dispersibility.

5. The epoxy resin composition of claim 1, wherein
    the alumina is introduced in the last step of a manufacturing process of the epoxy resin composition and manufactured in a nitrogen atmosphere, in order to prevent properties from deteriorating due to reaction of moisture and air when mixed with aluminum nitride.

6. The epoxy resin composition of claim 1, wherein
    the epoxy resin satisfies a thermal conductivity of at least 5 W/m·k when comprising the inorganic filler using in an amount of 85 to 90 wt % or more by mixing the alumina and the aluminum nitride.

7. A heat dissipation circuit board comprising:
    a metal plate;
    an insulating layer formed on an upper part of the metal plate; and
    a circuit pattern formed on an upper part of the insulating layer, wherein
    the insulating layer is formed by curing an epoxy resin composition comprising an epoxy resin, a curing agent and an inorganic filler, the inorganic filler includes alumina having a maximum particle diameter of less than 32 μm and aluminum nitride having a mean particle diameter of 0.5 to 1.0 μm, the inorganic filler is included in an amount of 85 wt % or more with respect to the total weight of the epoxy resin composition, the alumina is applied by mixing at least two types of alumina out of three types having a spherical shape and a mean particle diameter of 8.0, 2.0 and 0.8 μm, respectively, the epoxy resin composition includes 2 to 5 wt % of rubber oil resulting from reacting epoxy-modified butadiene rubber at a side chain and amine-modified silicon oil at both ends at 120° C. for 1 hour, in order to prevent defects in a processing process of a heat dissipation circuit board, which is caused by poor adhesion and vulnerability to internal impact due to a content of the inorganic filler of 85 wt % or more with respect to the total weight of the epoxy resin composition.

\* \* \* \* \*